United States Patent
Ikeda et al.

(10) Patent No.: US 11,430,712 B2
(45) Date of Patent: Aug. 30, 2022

(54) FILLING MEMBER BETWEEN A HEAT SINK AND SUBSTRATE

(71) Applicant: FUJITSU LIMITED, Kawasaki (JP)

(72) Inventors: Junya Ikeda, Atsugi (JP); Yoshihiro Nakata, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 52 days.

(21) Appl. No.: 17/166,418

(22) Filed: Feb. 3, 2021

(65) Prior Publication Data

US 2021/0287961 A1  Sep. 16, 2021

(30) Foreign Application Priority Data

Mar. 12, 2020 (JP) .............................. JP2020-043471

(51) Int. Cl.
*H01L 29/40* (2006.01)
*H01L 23/12* (2006.01)
(Continued)

(52) U.S. Cl.
CPC ...... *H01L 23/3737* (2013.01); *H01L 21/4853* (2013.01); *H01L 21/4857* (2013.01); *H01L 21/4871* (2013.01); *H01L 21/565* (2013.01); *H01L 21/76898* (2013.01); *H01L 23/3128* (2013.01); *H01L 23/3675* (2013.01);
(Continued)

(58) Field of Classification Search
CPC ..... H01L 25/0655; H01L 24/17; H01L 24/14; H01L 21/76898; H01L 21/4853; H01L 21/4857; H01L 21/4871; H01L 21/565; H01L 23/3737; H01L 23/3128; H01L 23/3675; H01L 23/481; H01L 23/49822;
(Continued)

(56) References Cited

U.S. PATENT DOCUMENTS

2006/0202312 A1* 9/2006 Iijima ................. H01Q 1/2283
257/664
2010/0244251 A1* 9/2010 Torazawa .......... H01L 21/76805
438/109

(Continued)

FOREIGN PATENT DOCUMENTS

JP   2006-147744 A   6/2006
JP   2018-085412 A   5/2018

*Primary Examiner* — Alonzo Chambliss
(74) *Attorney, Agent, or Firm* — Fujitsu Patent Center

(57) ABSTRACT

A semiconductor device includes: a semiconductor substrate; an electrode pad disposed over a first face of the semiconductor substrate; a redistribution layer electrically connected to the electrode pad; a through hole disposed in the semiconductor substrate so as to extend from a second face opposite to the first face of the semiconductor substrate to the electrode pad; an electrically conductive film covering an inner wall of the through hole, and electrically connected to the electrode pad; an electrically conductive adhesive disposed on a side of the second face of the semiconductor substrate, and electrically connected to the electrode pad via the electrically conductive film; a heat radiating member bonded to the second face of the semiconductor substrate with the electrically conductive adhesive; and a filling member with which the through hole is filled, the filling member being lower in coefficient of thermal expansion than the electrically conductive adhesive.

12 Claims, 6 Drawing Sheets

(51) Int. Cl.
*H01L 23/48* (2006.01)
*H01L 21/00* (2006.01)
*H05K 7/20* (2006.01)
*H01L 23/373* (2006.01)
*H01L 23/367* (2006.01)
*H01L 23/31* (2006.01)
*H01L 23/498* (2006.01)
*H01L 21/56* (2006.01)
*H01L 21/768* (2006.01)
*H01L 21/48* (2006.01)
*H01L 23/00* (2006.01)
*H01L 25/065* (2006.01)
*H01L 23/538* (2006.01)
*H01L 23/522* (2006.01)

(52) U.S. Cl.
CPC ...... *H01L 23/481* (2013.01); *H01L 23/49822* (2013.01); *H01L 23/49838* (2013.01); *H01L 23/5226* (2013.01); *H01L 23/5384* (2013.01); *H01L 24/14* (2013.01); *H01L 24/17* (2013.01); *H01L 25/0655* (2013.01)

(58) Field of Classification Search
CPC ........... H01L 23/49838; H01L 23/5384; H01L 23/5226
See application file for complete search history.

(56) References Cited

U.S. PATENT DOCUMENTS

| | | | |
|---|---|---|---|
| 2012/0146209 A1* | 6/2012 | Hu | H01L 24/19 257/692 |
| 2013/0277821 A1* | 10/2013 | Lundberg | H01L 23/36 257/713 |
| 2015/0061102 A1* | 3/2015 | Lin | H01L 31/02005 257/692 |
| 2015/0115433 A1* | 4/2015 | Lin | H01L 23/5389 438/122 |
| 2015/0262928 A1* | 9/2015 | Shen | H01L 21/76879 257/676 |
| 2016/0276307 A1* | 9/2016 | Lin | H01L 23/562 |

* cited by examiner

FIG. 5A  COMPARATIVE EXAMPLE
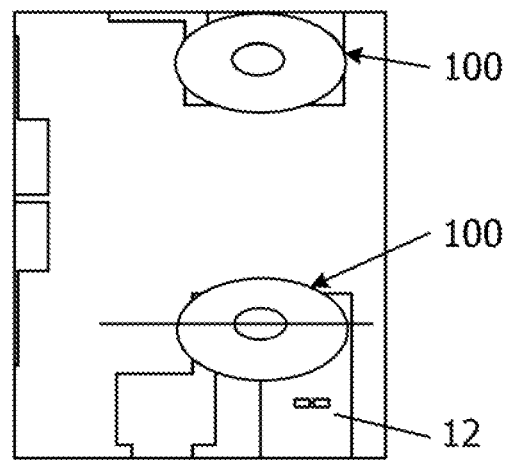
FIG. 5B  EMBODIMENT
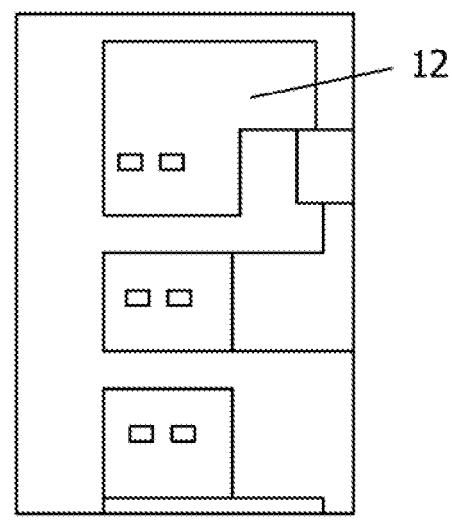

FILLING MEMBER BETWEEN A HEAT SINK AND SUBSTRATE

CROSS-REFERENCE TO RELATED APPLICATION

This application is based upon and claims the benefit of priority of the prior Japanese Patent Application No. 2020-43471, filed on Mar. 12, 2020, the entire contents of which are incorporated herein by reference.

FIELD

The embodiments discussed herein are related to a semiconductor device and a manufacturing method for a semiconductor device,

BACKGROUND

The following technique has been known as techniques concerning a structure in which a through hole formed in a substrate is filled with a filling member.

As the related art, Japanese Laid-open Patent Publication No. 2006-147744 and Japanese Laid-open Patent Publication No. 2018-85412 are disclosed.

SUMMARY

According to an aspect of the embodiments, a semiconductor device includes: a semiconductor substrate; an electrode pad disposed over a first face of the semiconductor substrate; a redistribution layer electrically connected to the electrode pad; a through hole disposed in the semiconductor substrate so as to extend from a second face opposite to the first face of the semiconductor substrate to the electrode pad; an electrically conductive film covering an inner wall of the through hole, and electrically connected to the electrode pad; an electrically conductive adhesive disposed on a side of the second face of the semiconductor substrate, and electrically connected to the electrode pad via the electrically conductive film; a heat radiating member bonded to the second face of the semiconductor substrate with the electrically conductive adhesive; and a filling member with which the through hole is filled, the filling member being lower in coefficient of thermal expansion than the electrically conductive adhesive.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5A is a photograph of an electrode pad of the semiconductor device according to the comparative example as seen in plan view; and FIG. 5B is a photograph of an electrode pad of the semiconductor device according to the embodiment of the disclosed technology as seen in plan view.

DESCRIPTION OF EMBODIMENTS

Figure 1:
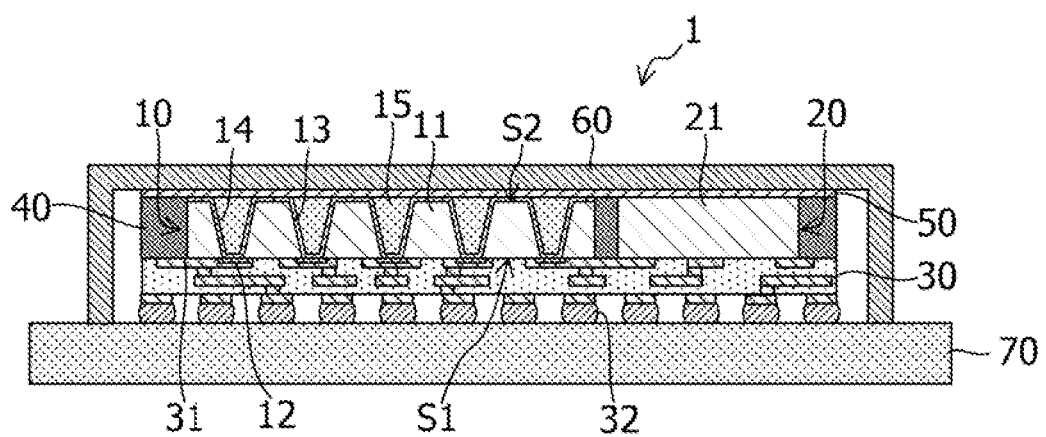
FIG. 1 is a sectional view illustrating an example of a configuration of a semiconductor device according to an embodiment of the disclosed technology.

For example, a known LED package includes: a light emitting element; a substrate supporting the light emitting element and having a through hole at a position where the light emitting element is placed; a filling member with which the through hole is filled, the filling member containing a filler; and a heat sink placed on a back face side of the substrate in close contact with the filling member.

Furthermore, a known through electrode substrate is a substrate having a through hole filled with an inorganic particle.

A fan-out wafer-level package (FOWLP) is a package including a plurality of semiconductor chips disposed in a close range. The FOWLP enables an increase in bandwidth and a reduction in transmission signal lass. In recent years, needs have been growing with regard to a power device-equipped FOWLP intended for a communication apparatus utilizing a millimeter waveband.

For example, a power device-equipped FOWLP has the following configuration. A semiconductor substrate constituting a power device has a first face on which an electrode pad is disposed, and a second face which is opposite to the first face and to which a heat radiating member is bonded. The heat radiating member is electrically connected to the electrode pad through a through via in the semiconductor substrate. The heat radiating member is bonded to the second face of the semiconductor substrate with an electrically conductive adhesive, such as a Ag paste, with which the through hole is filled and which covers the second face.

The power device is electrically bonded to a control device with a redistribution layer electrically connected to the electrode pad. The power device and the control device are integrally sealed with a sealing member such as a molding resin.

As described above, when the through hole is filled with the electrically conductive adhesive such as a Ag paste, the following problem may arise, The electrically conductive adhesive such as a Ag paste is higher in coefficient of thermal expansion than the semiconductor substrate. Accordingly, when the electrically conductive adhesive in the through hole shrinks due to a temperature change, the electrode pad connected to the through hole is pulled in the direction in which the electrically conductive adhesive shrinks. This may cause damage to the connection between the electrode pad and the redistribution layer. As described above, when the electrically conductive adhesive for bonding the heat radiating member to the semiconductor substrate is used as the filling member with which the through hole is filled, the electrode pad and the redistribution layer are disconnected from each other, which may lower product reliability.

The disclosed technology has been devised in view of the respect described above, and an object of the disclosed technology is to avoid a disconnection between an electrode pad and a redistribution layer by inhibiting a thermal shrinkage of a filling member with which a through hole is filled.

Hereinafter, an example of an embodiment of the disclosed technology will be described with reference to the drawings. It should be noted that in the respective drawings, identical or equivalent constituent elements and parts are denoted with identical reference signs, and the redundant description thereof will not be given here.

FIG. 1 is a sectional view illustrating an example of a configuration of a semiconductor device 1 according to the embodiment of the disclosed technology. It should be noted that FIG. 1 illustrates a mount board 70 on which the semiconductor device 1 is mounted, in addition to the semiconductor device 1. The semiconductor device 1 includes a package substrate 30 including a first semiconductor chip 10, a second semiconductor chip 20, and a redistribution layer 31, and a heat radiating member 60. The semiconductor device 1 takes a form of a FOWLP, in which the first semiconductor chip 10 and the second semiconductor chip 20 are combined.

The first semiconductor chip 10 may be a power device such as a power metal-oxide-semiconductor field-effect transistor (MOSFET). The second semiconductor chip 20 may be a control device configured to control a driven state of the first semiconductor chip 10.

The first semiconductor chip 10 includes, for example, a semiconductor substrate 11 containing a compound semiconductor such as GaN. The semiconductor substrate 11 has a first face S1 on which an electrode pad 12 is disposed. The semiconductor substrate 11 has a second face opposite to the first face S1, and a through hole 13 in the semiconductor substrate 11 extends from the second face to the electrode pad 12. The through hole 13 has an inner wall on which an electrically conductive film 14 containing, for example, Ni—Au is disposed. The through hole 13 and the electrically conductive film 14 disposed on the inner wall of the through hole 13 constitute a through via. The electrically conductive film 14 is electrically connected to the electrode pad 12 exposed at a bottom face of the through hole 13. The electrically conductive film 14 covers the entire second face S2 of the semiconductor substrate 11. It should be noted that the second face S2 of the semiconductor substrate 11 may be partially covered with the electrically conductive film 14. Furthermore, the electrically conductive film 14 may contain any electric conductor in addition to Ni—Au.

Figure 2:
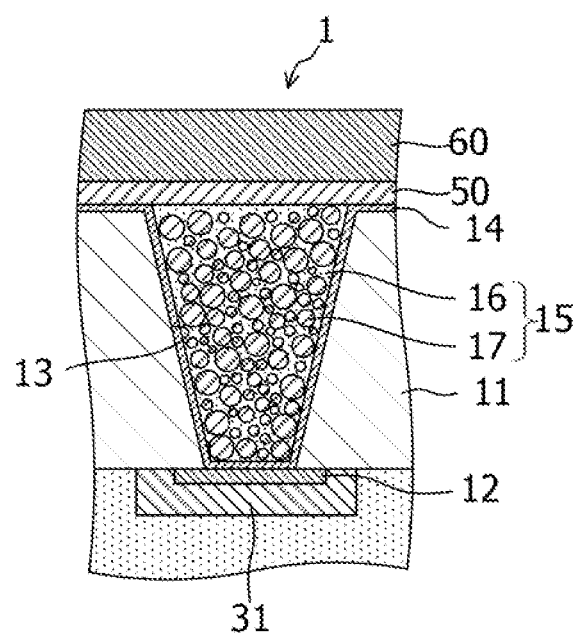
FIG. 2 is a sectional view illustrating a specific configuration of a filling member in a through hole according to the embodiment of the disclosed technology.

The through hole 13 is filled with a filling member 15. The filling member 15 is lower in coefficient of thermal expansion than an electrically conductive adhesive 50 to be described later. FIG. 2 is a sectional view illustrating a specific configuration of the filling member 15 in the through hole 13. As illustrated in FIG. 2, a filler-containing resin can suitably be used as the filling member 15, in which a resin 16 serving as a binder contains a filler 17. The resin 16 may be, for example, an epoxy-based resin or polyimide. The filler 17 preferably contains a material that is satisfactorily lower in coefficient of thermal expansion than the electrically conductive adhesive 50. For example, the filler 17 may contain a metal such as silicon oxide, alumina, or copper.

Preferably, a content of the filler 17 in the filler-containing resin is set such that the electrode pad 12 is not separated and disconnected from the redistribution layer 31 since the filling member 15 is pulled in a direction of a thermal shrinkage. For example, the content of the filler 17 is preferably 85% or more. The coefficient of thermal expansion of the filling member 15 can thus be significantly made lower than that of the electrically conductive adhesive 50.

Furthermore, the filler 17 preferably has a spherical shape of which the diameter ranges from 0.5 µm or more to 10 µm or less in a case where, for example, the through via has a diameter of 50 µm at its upper opening, a diameter of 30 µm at its bottom opening, and a height of 30 µm. This enables a higher content of the filler 17 in the filler-containing resin, and also enables a lower coefficient of thermal expansion of the filling member 15. For example, silicon oxide, alumina, copper, or the like can be used as the filler 17, and an epoxy-based resin or a polyimide resin can be used as the resin 16. Furthermore, the diameter of the filler 17 is preferably nonuniform within the foregoing range. This enables a still higher content of the filler 17 in the filler-containing resin.

The package substrate 30 including a plurality of the redistribution layers 31 stacked on top of each other is disposed on a side of the first face S1 of the semiconductor substrate 11. On the package substrate 30, the second semiconductor chip 20 is mounted beside the first semiconductor chip 10. The second semiconductor chip 20 includes a semiconductor substrate 21 different from the semiconductor substrate 11 constituting the first semiconductor chip 10. The redistribution layer 31 is electrically connected to the electrode pad 12 of the first semiconductor chip 10. The first semiconductor chip 10 (the semiconductor substrate 11) is electrically connected to the second semiconductor chip 20 (the semiconductor substrate 21) via the redistribution layer 31.

A plurality of terminals 32 are disposed on an opposite face of the package substrate 30 to the side on which the first semiconductor chip 10 and the second semiconductor chip 20 are mounted, Each of the plurality of terminals 32 is electrically connected to the redistribution layer 31. Each of the plurality of terminals 32 may take a form of, for example, a solder ball. Each of the plurality of terminals 32 is connected to a wire (not illustrated) formed on a surface of the mount board 70.

The first semiconductor chip 10 and the second semiconductor chip 20 are integrally sealed with a sealing member 40. For example, a thermosetting molding material such as an epoxy resin can suitably be used as the sealing member 40.

The electrically conductive film 14 covering the second face S2 of the first semiconductor chip 10, an upper face of the second semiconductor chip 20, and an upper face of the sealing member 40 extend in an identical plane, and these faces are covered with the electrically conductive adhesive 50. The electrically conductive adhesive 50 is disposed on a side of the second face S2 of the semiconductor substrate 11, and is electrically connected to the electrode pad 12 via the electrically conductive film 14. Preferably, the electrically conductive adhesive 50 contains a material that exhibits electric conduction and has a relatively high thermal conductivity. For example, an adhesive in which a thermosetting resin such as a Ag paste contains electric conductor particles can suitably be used as the electrically conductive adhesive 50.

The heat radiating member 60 is bonded, with the electrically conductive adhesive 50, to the second face S2 of the semiconductor substrate 11 constituting the first semiconductor chip 10 and an upper face of the semiconductor substrate 21 constituting the second semiconductor chip 20. The heat radiating member 60 radiates, into the atmosphere, heat generated from the first semiconductor chip 10 as the power device. The heat radiating member 60 is preferably made of a material exhibiting high electric conduction and thermal conduction. Examples of the material for the heat radiating member 60 may include metals such as copper, aluminum, and the like. The heat radiating member 60 is thermally connected to the first semiconductor chip 10, and is electrically connected to the electrode pad 12 via the electrically conductive adhesive 50 and the electrically conductive film 14. When the heat radiating member 60 is electrically connected to the electrode pad 12, an electric potential at the heat radiating member 60 can be fixed to a desired electric potential. In the present embodiment, the heat radiating member 60 takes a cap-shaped form having an accommodation space accommodating the first semiconductor chip 10, the second semiconductor chip 20, and the package substrate 30. This allows the heat radiating member 60 to function as an electromagnetic shield.

Hereinafter, a description will be given of a manufacturing method for the semiconductor device 1. FIGS. 3A to 3K are sectional views each illustrating an example of the manufacturing method for the semiconductor device 1.

Figure 3A:
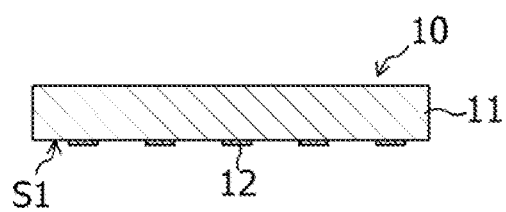
FIG. 3A is a sectional view illustrating an example of a manufacturing method for the semiconductor device according to the embodiment of the disclosed technology.

A diffusion layer (not illustrated) is formed by an ion implantation process on the semiconductor substrate 11 constituting the first semiconductor chip 10, and then the electrode pad 12 is formed on the first face S1 of the semiconductor substrate 11 (FIG. 3A).

Figure 3B:
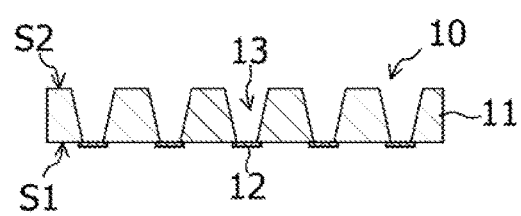
FIG. 3B is a sectional view illustrating an example of the manufacturing method for the semiconductor device according to the embodiment of the disclosed technology.

Next, the through hole 13 is formed by a publicly-known etching process in the semiconductor substrate 11 so as to extend from the second face S2 of the semiconductor substrate 11 to the electrode pad 12 (FIG. 3B).

Figure 3C:
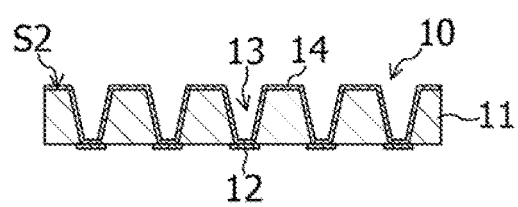
FIG. 3C is a sectional view illustrating an example of the manufacturing method for the semiconductor device according to the embodiment of the disclosed technology.

Next, the electrically conductive film 14 containing Ni— Au is formed by a publicly-known sputtering process so as to cover the inner wall of the through hole 13 and the second face S2 of the semiconductor substrate 11. The electrically conductive film 14 is electrically connected to the electrode pad 12 exposed at the bottom face of the through hole 13 (FIG. 3C).

Figure 3D:
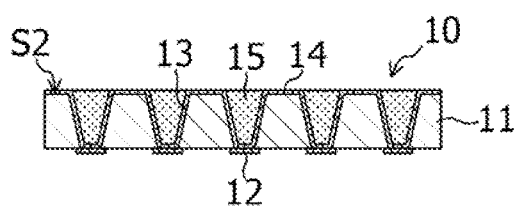
FIG. 3D is a sectional view illustrating an example of the manufacturing method for the semiconductor device according to the embodiment of the disclosed technology.
Figure 3E:
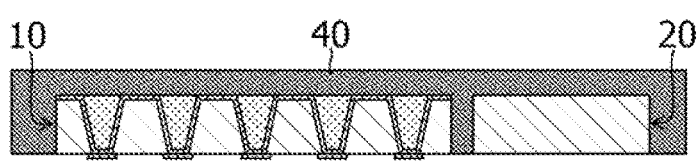
FIG. 3E is a sectional view illustrating an example of the manufacturing method for the semiconductor device according to the embodiment of the disclosed technology.

Next, the through hole 13 is filled with the filling member 15. A filler-containing resin can be used as the filling member 15. A paste-like filler-containing resin is supplied onto the second face S2 of the semiconductor substrate 11. The filler-containing resin is spread out over the entire second face S2 of the semiconductor substrate 11 by, for example, a spin coating process, so that each through hole 13 is filled with the filler-containing resin. Thereafter, the filler-containing resin is cured by heat treatment. It should be noted that the filling member 15 formed on the electrically conductive film 14 is removed by subsequent polishing treatment (FIG. 3D).

Figure 3F:
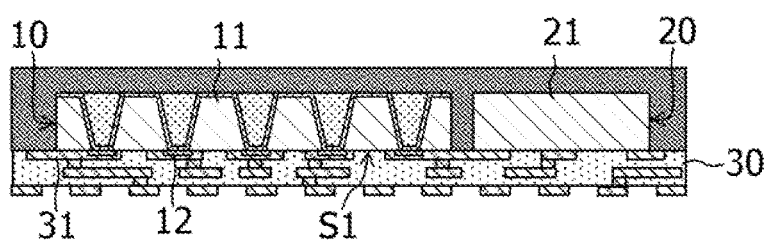
FIG. 3F is a sectional view illustrating an example of the manufacturing method for the semiconductor device according to the embodiment of the disclosed technology.
Figure 3G:
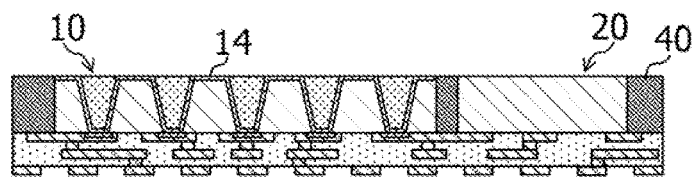
FIG. 3G is a sectional view illustrating an example of the manufacturing method for the semiconductor device according to the embodiment of the disclosed technology.

Next, the first semiconductor chip 10 and the second semiconductor chip 20 are integrally sealed with the sealing member 40 by a publicly-known molding process (FIG. 3E), Next, the package substrate 30 is formed on the side of the first face S1 of the semiconductor substrate 11. The package substrate 30 is formed using a publicly-known multilayer wiring process in such a manner that wiring layers and insulating layers are stacked alternately. The redistribution layer 31 is electrically connected to the electrode pad 12, and is also electrically connected to the second semiconductor chip 20. The first semiconductor chip 10 (the semiconductor substrate 11) and the second semiconductor chip 20 (the semiconductor substrate 21) are electrically connected to each other via the redistribution layer 31 (FIG. 3F).

Figure 3H:
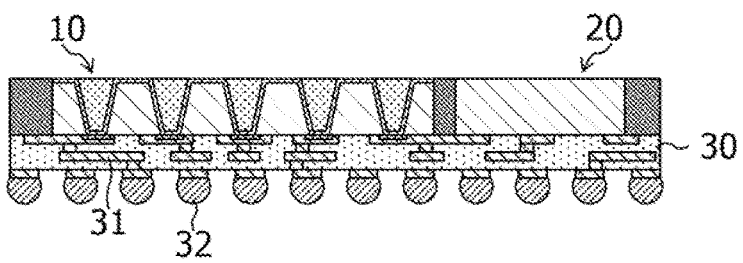
FIG. 3H is a sectional view illustrating an example of the manufacturing method for the semiconductor device according to the embodiment of the disclosed technology.

Next, the upper face of the sealing member 40 is polished to expose the electrically conductive film 14 disposed on the first semiconductor chip 10 and the upper face of the second semiconductor chip 20 (FIG. 3G), Next, the terminals 32 electrically connected to the redistribution layer 31 are formed on the opposite face of the package substrate 30 to the side on which the first semiconductor chip 10 and the second semiconductor chip 20 are mounted. Each of the terminals 32 may take a form of, for example, a solder ball (FIG. 3H).

Figure 3I:
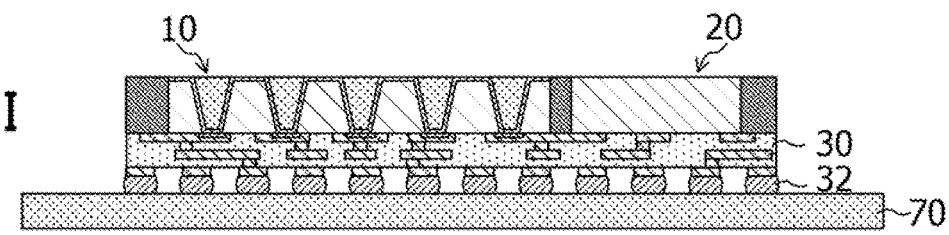
FIG. 3I is a sectional view illustrating an example of the manufacturing method for the semiconductor device according to the embodiment of the disclosed technology.

Next, the terminals 32 are connected by a reflow process to wires (not illustrated) formed on the surface of the mount board 70, so that the structural body including the package substrate 30, the first semiconductor chip 10, and the second semiconductor chip 20 is mounted on the mount board 70 (FIG. 3I).

Figure 3J:
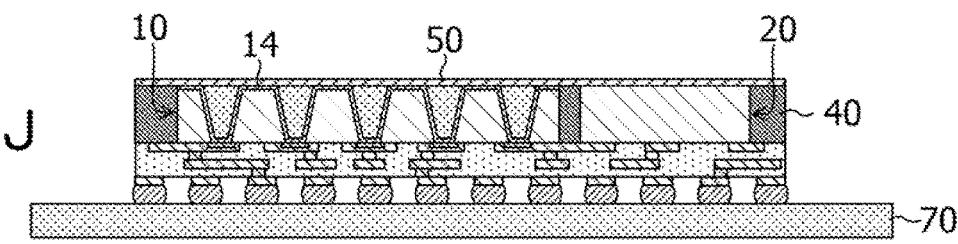
FIG. 3J is a sectional view illustrating an example of the manufacturing method for the semiconductor device according to the embodiment of the disclosed technology.

Next, the electrically conductive adhesive 50 in which a thermosetting resin such as a Ag paste contains electric conductor particles is formed on a plane including the surface of the electrically conductive film 14, the upper face of the second semiconductor chip 20, and the upper face of the sealing member 40 (FIG. 3J).

Figure 3K:
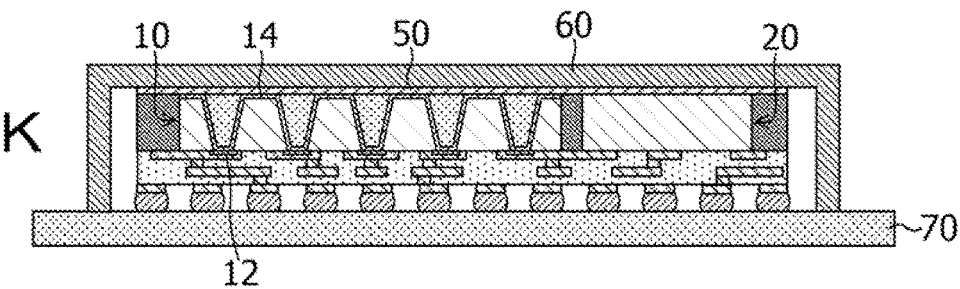
FIG. 3K is a sectional view illustrating an example of the manufacturing method for the semiconductor device according to the embodiment of the disclosed technology.

Next, the heat radiating member 60 is bonded to the first semiconductor chip 10 and the second semiconductor chip 20 with the electrically conductive adhesive 50. The heat radiating member 60 is thermally connected to the first semiconductor chip 10, and is electrically connected to the electrode pad 12 via the electrically conductive adhesive 50 and the electrically conductive film 14 (FIG. 3K).

It should be noted that treatment to roughen the second face S2 of the semiconductor substrate 11 constituting the first semiconductor chip 10 and the upper face of the semiconductor substrate 21 constituting the second semiconductor chip 20 may be carried out before formation of the electrically conductive film 14. This produces an anchor effect, and thus enables an enhanced bonding strength between the semiconductor substrates 11 and 21 and the electrically conductive film 14 and an enhanced bonding strength between the electrically conductive film 14 and the electrically conductive adhesive 50.

Figure 4:
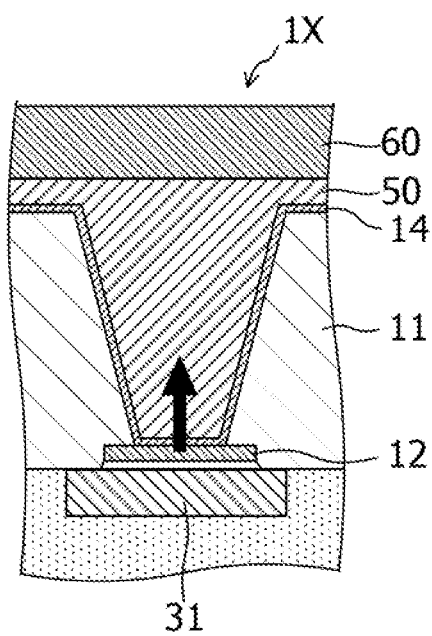
FIG. 4 is a sectional view illustrating an example of a partial configuration of a semiconductor device according to a comparative example.

Here, FIG. 4 is a sectional view illustrating an example of a partial configuration of a semiconductor device 1X according to a comparative example. The semiconductor device 1X according to the comparative example is different from the semiconductor device 1 according to the embodiment of the disclosed technology in a respect that a through hole 13 is filled with an electrically conductive adhesive 50 such as a Ag paste. For example, in the semiconductor device 1X according to the comparative example, the electrically conductive adhesive 50 functions as an adhesive for thermally and electrically bonding a heat radiating member 60 to a semiconductor substrate 11, and also functions as a filling member with which the through hole 13 is filled.

When the through hole 13 is filled with the electrically conductive adhesive 50 in this way, the following problem may arise. The electrically conductive adhesive 50 such as a Ag paste is higher in coefficient of thermal expansion than the semiconductor substrate 11, Accordingly, when the electrically conductive adhesive 50 in the through hole 13 shrinks due to a temperature change, an electrode pad 12 is pulled in the direction in which the electrically conductive adhesive 50 shrinks. This may cause damage to the connection between the electrode pad 12 and a redistribution layer 31 as illustrated in FIG. 4.

FIG. 5A is a photograph of the electrode pad 12 of the semiconductor device 1X according to the comparative example illustrated in FIG. 4, as seen in plan view. FIG. 5A illustrates a state in which the electrode pad 12 is pulled in the direction in which the electrically conductive adhesive in the through hole shrinks, so that a dent 100 is formed in the electrode pad 12.

On the other hand, in the semiconductor device 1 according to the disclosed technology, a material that is lower in coefficient of thermal expansion than a material for the electrically conductive adhesive 50 is used for the filling member 15 with which the through hole 13 is filled. For example, the filling member 15 contains a material different from that for the electrically conductive adhesive 50. This enables inhibition of a thermal shrinkage of the filling member 15 with which the through hole 13 is filled, and also enables avoidance of a disconnection between the electrode pad 12 and the redistribution layer 31. It should be noted that since the electrically conductive adhesive 50 has a small thickness and is smaller in volume than the filling member 15, an influence to be exerted on the filling member 15 is small even when the electrically conductive adhesive 50 shrinks. Therefore, this enables avoidance of separation of the electrically conductive adhesive 50 from the filling member 15.

FIG. 5B is a photograph of the electrode pad 12 of the semiconductor device 1 according to the embodiment of the disclosed technology as seen in plan view. The semiconductor device 1 according to the disclosed technology avoids the thermal shrinkage of the filling member and generates no dent 100 illustrated in FIG. 5A.

It should be noted that the semiconductor device 1 is an example of a semiconductor device in the disclosed technology. The semiconductor substrate 11 is an example of a semiconductor substrate in the disclosed technology. The semiconductor substrate 21 is an example of a second semiconductor substrate in the disclosed technology. The electrode pad 12 is an example of an electrode pad in the disclosed technology. The redistribution layer 31 is an example of a redistribution layer in the disclosed technology. The through hole 13 is an example of a through hole in the disclosed technology. The electrically conductive film 14 is an example of an electrically conductive film in the disclosed technology. The electrically conductive adhesive 50 is an example of an electrically conductive adhesive in the disclosed technology. The heat radiating member 60 is an example of a heat radiating member in the disclosed technology.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a semiconductor substrate;
   an electrode pad disposed over a first face of the semiconductor substrate;
   a redistribution layer electrically connected to the electrode pad;
   a through hole disposed in the semiconductor substrate so as to extend from a second face opposite to the first face of the semiconductor substrate to the electrode pad;
   an electrically conductive film covering an inner wall of the through hole, and electrically connected to the electrode pad;
   an electrically conductive adhesive disposed on a side of the second face of the semiconductor substrate, and electrically connected to the electrode pad via the electrically conductive film;
   a heat radiating member bonded to the second face of the semiconductor substrate with the electrically conductive adhesive; and
   a filling member with which the through hole is filled, the filling member being lower in coefficient of thermal expansion than the electrically conductive adhesive.

2. The semiconductor device according to claim 1, wherein
   the filling member includes a filler-containing resin.

3. The semiconductor device according to claim 2, wherein
   the filler-containing resin has a filler content of 85% or more.

4. The semiconductor device according to claim 2, wherein
   the filler-containing resin contains a filler having a spherical shape ranging from 0.5 µm or more to 10 µm or less in diameter.

5. The semiconductor device according to claim 4, wherein
   the filler contained in the filler-containing resin has a nonuniform diameter.

6. The semiconductor device according to claim 1, further comprising:
   a second semiconductor substrate different from the semiconductor substrate; and
   a sealing member integrally sealing the semiconductor substrate and the second semiconductor substrate, wherein
   the semiconductor substrate and the second semiconductor substrate are electrically connected to each other via the redistribution layer.

7. A manufacturing method for a semiconductor device, the manufacturing method comprising:
   forming a through hole in a semiconductor substrate having over a first face an electrode pad, so as to extend from a second face opposite to the first face to the electrode pad;
   forming an electrically conductive film covering an inner all of the through hole, and electrically connected to the electrode pad;
   filling the through hole with a filling member;

forming a redistribution layer electrically connected to the electrode pad;

forming an electrically conductive adhesive electrically connected to the electrode pad via the electrically conductive film, on the second face of the semiconductor substrate; and forming a heat radiating member bonded to the second face of the semiconductor substrate with the electrically conductive adhesive, wherein the filling member is lower in coefficient of thermal expansion than the electrically conductive adhesive.

8. The manufacturing method according to claim 7, wherein the filling member includes a filler-containing resin.

9. The manufacturing method according to claim 8, wherein the filler-containing resin has a filler content of 85% or more.

10. The manufacturing method according to claim 8, wherein the filler-containing resin contains a filler having a spherical shape ranging from 0.5 µm or more to 10 µm or less in diameter.

11. The manufacturing method according to claim 10, wherein the filler contained in the filler-containing resin has a nonuniform diameter.

12. The manufacturing method according to claim 7, further comprising:

integrally sealing the semiconductor substrate and a second semiconductor substrate different from the semiconductor substrate, wherein the semiconductor substrate and the second semiconductor substrate are electrically connected to each other via the redistribution layer.

* * * * *